United States Patent
Dargis et al.

(10) Patent No.: US 8,846,504 B1
(45) Date of Patent: Sep. 30, 2014

(54) GAN ON SI(100) SUBSTRATE USING EPI-TWIST

(71) Applicants: Rytis Dargis, Fremont, CA (US);
Andrew Clark, Los Altos, CA (US);
Erdem Arkun, San Carlos, CA (US);
Radek Roucka, Mountain View, CA (US)

(72) Inventors: Rytis Dargis, Fremont, CA (US);
Andrew Clark, Los Altos, CA (US);
Erdem Arkun, San Carlos, CA (US);
Radek Roucka, Mountain View, CA (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 14/075,032

(22) Filed: Nov. 8, 2013

(51) Int. Cl.
*H01L 21/20* (2006.01)
*C30B 23/00* (2006.01)
*H01L 21/02* (2006.01)

(52) U.S. Cl.
CPC .... *H01L 21/02488* (2013.01); *H01L 21/02433* (2013.01); *H01L 21/0254* (2013.01)
USPC .......................................... 438/481; 117/101

(58) Field of Classification Search
CPC .................. H01L 21/02488; H01L 21/02433; H01L 21/0254; H01L 39/2458; H01L 41/187; H01L 41/1871
USPC .......................................................... 438/481
See application file for complete search history.

(56) References Cited

U.S. PATENT DOCUMENTS

| 6,093,338 | A  | * | 7/2000 | Tani et al. ................ 252/62.9 R |
| 7,105,866 | B2 | * | 9/2006 | El-Zein et al. ................ 257/104 |
| 8,268,076 | B2 | * | 9/2012 | Schroeder et al. .............. 117/89 |
| 8,501,635 | B1 | * | 8/2013 | Clark et al. .................... 438/779 |
| 8,636,844 | B1 | * | 1/2014 | Dargis et al. .................... 117/93 |

* cited by examiner

*Primary Examiner* — William D Coleman
(74) *Attorney, Agent, or Firm* — Parsons & Goltry; Robert A. Parsons; Michael W. Goltry

(57) ABSTRACT

A method of growing GaN material on a silicon substrate includes providing a single crystal silicon substrate with a (100) surface orientation or a (100) with up to a 10° offset surface orientation and using epi-twist technology, epitaxially growing a single crystal stress managing layer on the silicon substrate. The single crystal stress managing layer includes rare earth oxide with a (110) crystal orientation and a cubic crystal structure. The method further includes epitaxially growing a single crystal buffer layer on the stress managing layer. The single crystal buffer layer includes rare earth oxide with a lattice spacing closer to a lattice spacing of GaN than the rare earth oxide of the stress managing layer. Epitaxially growing a layer of single crystal GaN material on the surface of the buffer, the GaN material having one of a (11-20) crystal orientation and a (0001) crystal orientation.

8 Claims, 1 Drawing Sheet

GAN ON SI(100) SUBSTRATE USING EPI-TWIST

FIELD OF THE INVENTION

This invention relates in general to the growth of GaN material on a Si(100) and more specifically to the formation of a buffer formed by epi-twist technology between the silicon substrate and a GaN layer.

BACKGROUND OF THE INVENTION

In the semiconductor industry, Si(100) oriented substrates are used in most part because of the enhanced carrier mobility. Growth of GaN on Si(100) substrates would be of advantage because of easier integration of GaN and Si electronic circuits. it is known that growing GaN, on a silicon substrate is difficult due in large part to the large crystal lattice mismatch (−16.9%) and the thermal mismatch (53%) between silicon and GaN. Thus, some type of buffer layer or layers is generally formed on the silicon substrate and the GaN material is grown on the buffer layer. Generally, the prior art buffer layers are either complicated and expensive to form or do no adequately reduce the strain in the GaN due to crystal lattice mismatch.

It would be highly advantageous, therefore, to remedy the foregoing and other deficiencies inherent in the prior art.

Accordingly, it is an object of the present invention to provide new and improved methods for the growth of single crystal GaN material on a Si(100) substrate.

It is another object of the present invention to provide new and improved methods for the growth of single crystal GaN material on a Si(100) substrate with reduced dislocation density and relatively simple to perform.

It is another object of the present invention to provide new and improved substantially stress free, single crystal GaN layers grown on a Si(100) substrate.

SUMMARY OF THE INVENTION

Briefly, the desired objects and aspects of the instant invention are realized in accordance with a method of growing GaN material on a silicon substrate including providing a single crystal silicon substrate with a (100) surface orientation or a (100) with up to 10° offset surface orientation and using epi-twist technology, epitaxially growing a single crystal stress managing layer on the silicon substrate. The single crystal stress managing layer includes rare earth oxide with a (110) crystal orientation and a cubic crystal structure. The method further includes epitaxially growing a single crystal buffer layer on the stress managing layer. The single crystal buffer layer includes rare earth oxide with a lattice spacing closer to a lattice spacing of GaN than the rare earth oxide of the stress managing layer. A layer of single crystal GaN material is then epitaxially grown on the surface of the buffer, the GaN material having one of a (11-20) crystal orientation and a (0001) crystal orientation.

The desired objects and aspects of the instant invention are further realized in GaN semiconductor material grown on a silicon substrate. The product including a single crystal silicon substrate with a (100) surface orientation or a (100) with up to 10° offset surface orientation and a single crystal stress managing layer positioned on the silicon substrate. The single crystal stress managing layer includes rare earth oxide with a (110) crystal orientation and a cubic crystal structure. A single crystal buffer is positioned on the stress managing layer and includes rare earth oxide with a (110) crystal orientation. A layer of single crystal GaN material is positioned on the surface of the buffer and has one of a (11-20) crystal orientation and a (0001) crystal orientation.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
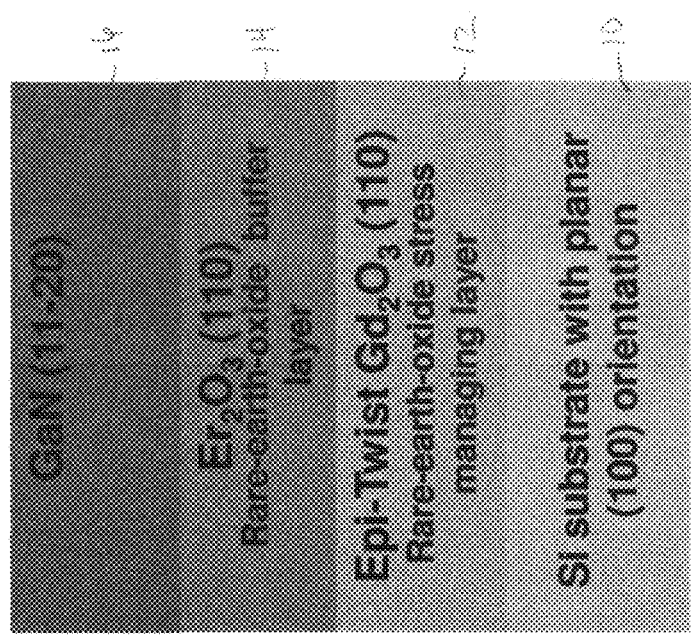
FIG. 1 is a simplified layer diagram illustrating a method of growing GaN material on a Si(100) substrate, in accordance with the present invention.

Turning to FIG. 1, a simplified layer diagram is illustrated representing several steps in a process of growing GaN material on a silicon substrate 10, in accordance with the present invention. It will be understood that substrate 10 is or may be a standard well known single crystal wafer or portion thereof generally known and used in the semiconductor industry. Also, the term "substrate" simply refers to a supporting structure and may be a layer of silicon-containing material positioned on a base layer of other material such as an oxide or the like. Single crystal substrates in this disclosure, it will be understood, are limited to (100) silicon and off axis orientations up to Si(100) up to 10° off. The Si(100) substrate could also include various miscuts with nominal value between 0 and 10° in any direction. The (100) orientation of substrate 10 with or without offset or off-axis orientation is preferred but off-axis Si(100) helps to grow domain free oxide layers thereon.

Silicon has a cubic crystal orientation and many other III-N materials, such as GaN, have a hexagonal crystal orientation. Epitaxially growing hexagonal crystals onto cubic crystals will generally generate huge lattice mismatch and a large dislocation density or crystal defects which will limit the usefulness of the material for device design. Further, because of the mismatch and subsequent dislocation density or defects, the thickness of a layer of GaN material is severely limited since the defects expand as the thickness becomes greater. Thus, it is difficult to grow single crystal GaN onto a single crystal silicon substrate since the different crystals of the two materials are difficult or impossible to lattice match.

In the present invention, as illustrated in FIG. 1, a stress managing layer 12 of single crystal rare earth oxide is epitaxially grown on silicon substrate 10. Layer 12 preferably includes a rare earth oxide with a crystal lattice spacing close to the spacing of silicon. Various rare earth oxides have a crystal lattice spacing that can be substantially matched to silicon with very little strain. For example, $Gd_2O_3$ has a crystal lattice spacing (a) of 10.81 Å, $Er_2O_3$ has a crystal lattice spacing (a) of 10.55 Å, $Nd_2O_3$ has a crystal lattice spacing (a) of 11.08 Å, and silicon has a double spacing (2a) of 10.86 Å. Also, two or more rare earth materials can be mixed in a layer or layers to bring the crystal spacing to a desired level and produce tensile or compressive strain as desired to offset strain in later deposited layers. Thus, $REOa$~$Si2a$ herein is defined as a "substantial crystallographic match". Further, the crystal lattice spacing of the REO layer or layers can be varied by varying the composition of the constituents.

Stress managing layer 12 is epitaxially grown on substrate 10 using a technology known as "epi-twist". Additional and more specific information on epi-twist technology is available, for example, in a co-owned (owned by applicants' assignee) U.S. Pat. No. 8,106,381, entitled "Semiconductor Structures with Rare-Earths", issued Jan. 31, 2012, and incorporated herein by reference. In the '381 patent the technology is used for the formation of SOI and GOI structures.

Using the epi-twist technology, the rare earth oxide material of layer 12 retains a cubic crystalline structure, the same as silicon, but the orientation changes to a (110) surface orientation. In this example $Gd_2O_3$ is the preferred rare earth oxide and provides a substantial crystallographic match with silicon substrate 10 while changing to the (110) orientation. While gadolinium is the preferred rare earth material, any rare earth material that crystallizes into a cubic form, such as any of the rare earths with a larger atomic number than gadolinium can be used. Single crystal gadolinium oxide ($Gd_2O_3$) is epitaxially grown on silicon substrate 10 preferably by MBE but could instead be grown by MOCVD or any other technique, depending upon the specific application and additional growth techniques utilized.

A buffer layer 14 of rare earth oxide is epitaxially grown on the surface of stress managing layer 12 preferably by MBE but could instead be grown by MOCVD or any other technique. Buffer layer 14, because it is grown epitaxially on layer 12, has a (110) crystal orientation, the same as stress managing layer 12 but has a crystal spacing that more closely matches the spacing of GaN. In this specific example, buffer layer 14 includes single crystal erbium oxide ($Er_2O_3$) with a slightly smaller crystal spacing than the crystal spacing of the single crystal gadolinium oxide ($Gd_2O_3$), which reduces any stress in subsequent layers so that a substantially deformation free layer can be grown.

Figure 2:
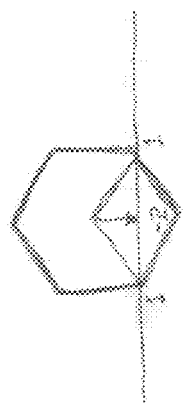
FIG. 2 is a representative drawing of a GaN hexagonal (11-20) orientation.

A layer 16 of single crystal GaN is epitaxially grown on buffer layer 14 preferably by MBE but could instead be grown by MOCVD or any other technique. GaN layer 16 has a (11-20) crystal orientation as illustrated in FIG. 2. The (11-20) orientation represents a hexagonal prism on its side as shown (the view direction being from the end of the prism). It will be understood that GaN layer 16 can have a (0001) crystal orientation, as GaN and AlN have when grown directly on Si(110), but will be grown with less stress and, therefore, reduced dislocation density.

Figure 3:
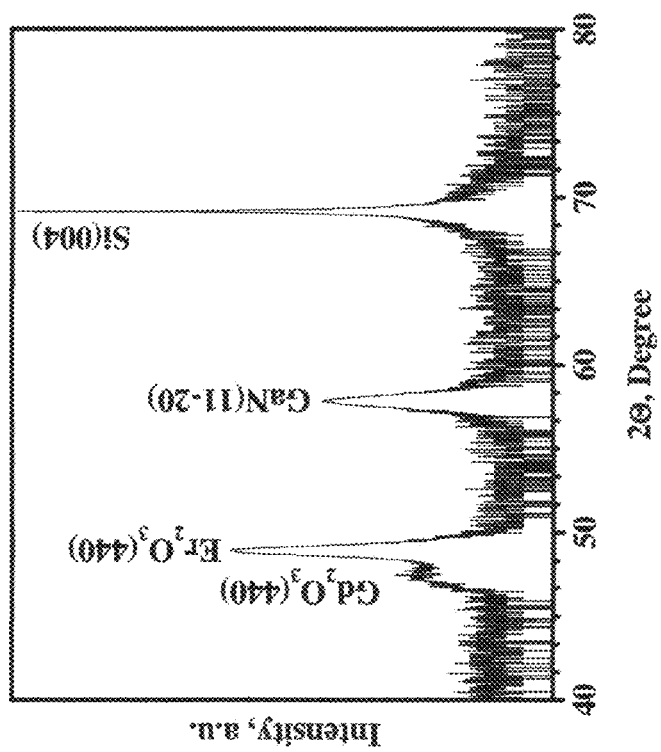
FIG. 3 is an X-ray diffraction 2Θ-ω scan of the grown structure illustrated in FIG. 1.

FIG. 3 illustrates an X-ray diffraction 2Θ-ω scan of the grown structure illustrated in FIG. 1, showing the intensity peaks of the silicon, gadolinium oxide, erbium oxide, and gallium nitride of the structure illustrated in FIG. 1

Thus, a new and novel method of growing GaN on a Si(100) substrate has been disclosed. The new method provides the GaN in a form that is convenient for use in electronic and photonic devices and is easy to perform. Further, the GaN layer has a reduced dislocation density. A major advantage realized by growing GaN on a Si(100) substrate is that GaN electronic devices can be conveniently integrated into Si CMOS circuits. Also, the GaN layer grown in the (11-20) orientation reduces spontaneous polarization and increases the effectiveness of GaN photonic devices.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of growing GaN material on a silicon substrate comprising the steps of:
    providing a single crystal silicon substrate with a (100) surface orientation or a (100) with up to 10° offset surface orientation;
    using epi-twist technology, epitaxially growing a single crystal stress managing layer on the silicon substrate, the single crystal stress managing layer including rare earth oxide with a (110) crystal orientation and a cubic crystal structure;
    epitaxially growing a single crystal buffer layer on the stress managing layer, the single crystal buffer layer including rare earth oxide with a lattice spacing closer to a lattice spacing of GaN than the rare earth oxide of the stress managing layer; and
    epitaxially growing a layer of single crystal GaN material on the surface of the buffer, the GaN material having one of a (11-20) crystal orientation and a (0001) crystal orientation.

2. The method as claimed in claim 1 wherein the single crystal stress managing layer includes single crystal gadolinium oxide ($Gd_2O_3$).

3. The method as claimed in claim 1 wherein the single crystal buffer layer includes single crystal erbium oxide ($Er_2O_3$).

4. A method of growing GaN material on a silicon substrate comprising the steps of:
    providing a single crystal silicon substrate with a (100) surface orientation or a (100) with up to a 10° offset surface orientation;
    using epi-twist technology, epitaxially growing a single crystal stress managing layer on the silicon substrate, the single crystal stress managing layer including single crystal gadolinium oxide ($Gd_2O_3$) with a (110) crystal orientation with a cubic crystal structure and substantially crystal lattice matched to the surface of the silicon substrate;
    epitaxially growing a single crystal buffer layer on the stress managing layer, the single crystal buffer layer including single crystal erbium oxide ($Er_2O_3$) with a lattice spacing closer to a lattice spacing of GaN than the rare earth oxide of the stress managing layer; and
    epitaxially growing a layer of single crystal GaN semiconductor material on the surface of the buffer, the GaN semiconductor material having one of a (11-20) crystal orientation and a (0001) crystal orientation.

5. GaN semiconductor material grown on a silicon substrate comprising:
    a single crystal silicon substrate with a (100) surface orientation or a (100) with up to 10° offset surface orientation;
    a single crystal stress managing layer positioned on the silicon substrate, the single crystal stress managing layer including rare earth oxide with a (110) crystal orientation and a cubic crystal structure;
    a single crystal buffer positioned on the stress managing layer and including rare earth oxide with a (110) crystal orientation; and
    a layer of single crystal GaN material positioned on the surface of the buffer and having one of a (11-20) crystal orientation and a (0001) crystal orientation.

6. The GaN semiconductor material grown on a silicon substrate as claimed in claim 5 wherein the single crystal stress managing layer includes single crystal gadolinium oxide ($Gd_2O_3$).

7. The GaN semiconductor material grown on a silicon substrate as claimed in claim 5 wherein the single crystal buffer layer includes single crystal erbium oxide ($Er_2O_3$).

8. GaN semiconductor material grown on a silicon substrate comprising:
- a single crystal silicon substrate with a (100) orientation or a (100) with up to 10° offset orientation;
- a single crystal stress managing layer positioned on the silicon substrate, the single crystal stress managing layer including single crystal gadolinium oxide ($Gd_2O_3$) with a (110) crystal orientation and a cubic crystal structure substantially crystal lattice matched to the surface of the silicon substrate;
- a single crystal buffer positioned on the stress managing layer and including single crystal erbium oxide ($Er_2O_3$) with a (110) crystal orientation; and
- a layer of single crystal GaN semiconductor material positioned on the surface of the buffer and having one of a (11-20) crystal orientation and a (0001) crystal orientation.

\* \* \* \* \*